(12) United States Patent
Hembree

(10) Patent No.: US 6,189,772 B1
(45) Date of Patent: Feb. 20, 2001

(54) METHOD OF FORMING A SOLDER BALL

(75) Inventor: David R. Hembree, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/143,996

(22) Filed: Aug. 31, 1998

(51) Int. Cl.[7] .......................... B23K 35/12; B23K 31/00
(52) U.S. Cl. ...................................... 228/254; 228/180.22
(58) Field of Search .............................. 228/254, 180.22; 438/612

(56) References Cited

U.S. PATENT DOCUMENTS

| 3,436,818 | * | 4/1969 | Merrin et al. | 29/626 |
|---|---|---|---|---|
| 4,924,353 | * | 5/1990 | Patraw | 361/400 |
| 5,048,747 | * | 9/1991 | Clark et al. | 228/180.2 |
| 5,244,143 | | 9/1993 | Ference et al. | 228/180.21 |
| 5,381,848 | * | 1/1995 | Trabucco | 164/102 |
| 5,492,863 | * | 2/1996 | Higgins, III | 437/183 |
| 5,505,367 | * | 4/1996 | Degani et al. | 228/248.1 |
| 5,607,099 | * | 3/1997 | Yeh et al. | 228/180.22 |
| 5,643,831 | * | 7/1997 | Ochiai et al. | 437/183 |
| 5,658,827 | * | 8/1997 | Aulicino et al. | 228/180.22 |
| 5,659,952 | * | 8/1997 | Kovac et al. | 29/840 |
| 5,718,367 | * | 2/1998 | Covell, II et al. | 228/254 |
| 5,735,452 | * | 4/1998 | Yu et al. | 228/254 |
| 5,817,545 | * | 10/1998 | Wang et al. | 438/127 |
| 5,829,668 | * | 11/1998 | George et al. | 228/254 |
| 5,855,323 | * | 1/1999 | Yost et al. | 239/135 |
| 5,925,934 | * | 7/1999 | Lim | 257/778 |
| 5,938,106 | * | 8/1999 | Pierson | 228/246 |
| 5,950,908 | * | 9/1999 | Fujino et al. | 228/248.1 |
| 5,984,164 | * | 11/1999 | Wark | 228/164 |
| 6,029,882 | * | 2/2000 | Bolde et al. | 228/254 |

* cited by examiner

Primary Examiner—Patrick Ryan
Assistant Examiner—L. Edmondson
(74) Attorney, Agent, or Firm—Workman, Nydegger & Seeley

(57) ABSTRACT

The present invention is drawn to a method of making solder bump interconnections or BGAs ranging from chip-level connections to either single chip or multichip modules, flip-chip packages and printed circuit boards connections. According to the method of the present invention, a die wafer or a substrate with a conductive contact location is positioned in close proximity and aligned with a mold wafer having a pocket corresponding to the contact location of the die wafer. A source of a molten solder is also provided which interconnects with the mold wafer. The molten solder from the source is introduced into the pocket of the mold wafer such that the molten solder wets the contact location aligned with the pocket. Before the molten solder inside the pocket is allowed to solidify, the die wafer and the mold wafer are separated from each other. Some of the molten solder is attracted to the contact location of the die wafer as it separates from the remaining molten solder in the pocket so as to assume the shape of a partial sphere. The method of the present invention is especially useful for batch processing in the formation of a large number of solder balls.

26 Claims, 4 Drawing Sheets

METHOD OF FORMING A SOLDER BALL

BACKGROUND OF THE INVENTION

1. The Field of the Invention

The present invention is directed to semiconductor device assemblies. More specifically, the present invention is directed to a method for forming connections, such as ball grid arrays, on a semiconductor chip, substrate or semiconductor package.

2. Background of the Invention

As integrated circuits become larger and more complex, the demand for the increased number of external connections on chips, semiconductor substrates and packages has rapidly grown. The most common methods for connection of the packaged devices to external systems are wire bonding, tape automated bonding and solder bumping. Among these technologies, solder bumping provides the highest packaging density with less packaging delay. Therefore, solder bumping or creation of ball or bumped grid arrays (BGAs) is rapidly developing as the technology of choice for high input/output count integrated circuits. A BGA design is part of an integrated circuit package in which the input and output points are solder bumps (or balls) arranged in a grid pattern. BGA designs are used in various package configurations, including a single chip or multichip applications.

Solders have been commonly used as interconnecting material for electronic packaging and assembly. A typical ball grid array package has a large number of solder balls or bumps disposed on a surface of the package. The package surface is usually formed from an electrically insulating material with a pattern of metalized pads disposed on it. These pads connect to circuity of a semiconductor device within the package. BGA packaging technology offers superior thermal, electrical, and size performance compared to other existing package technologies. One challenge affecting BGA technology, however, is to achieve the interconnect density required to route area array devices or packages, at a cost compatible with the commercial marketplace. Another concern is uniformity of the balls across a semiconductor device during fabrication of solder ball arrays. Finally, a badly bonded ball or voids in the solder balls can lead to faulty operation of the device.

Several different methods have been developed for forming ball grid arrays or solder bumps. Many of these methods use preformed solder balls and place these preformed balls on the package contact pads. For example, some methods use reflow soldering which is a process for joining parts to a substrate by depositing solder paste, placing parts (for example, preformed solder balls), heating until the solder fuses, and allowing them to cool in a joined position. Since it is very difficult to ensure that the correct amount of paste is applied to the electrical contacts, these methods are complicated, time consuming and not cost-effective.

As an alternative, a solder paste is disposed on the contact pads in specifically measured quantities. Thereafter the paste is heated and while it melts, it assumes the spherical shapes to form the ball grid contacts. This method also has a number of disadvantages because of the difficulties with measuring the exact quantities of solder paste and dealing with the elasticity, viscosity and other important characteristics of the paste. The smaller contact pads and narrower spacing between the contact pads require a higher level of precision in solder paste deposition and in component placement, and require higher quality and consistency in solder paste. Moreover, the shape and the size of the resulting balls are often not uniform because it is difficult to control the wettable exposed area of the contact pad covered by the solder paste while it is melting. Therefore, this and similar methods inevitably result in a complex manufacturing process with rigorous process control and the resulting higher costs.

Another conventional method of creation of the solder bumps is by evaporation. Evaporation does not create uniform solder ball heights and can be time-consuming. Similarly, wire bonding with solder has not been able to yield consistent ball size and adhesion strength.

One example of the method for forming raised bump contacts on a substrate is disclosed in the U.S. Pat. No. 5,381,848 to Trabucco which is fully incorporated herein by reference. In that patent, a substrate upon a surface of which the solder bumps are formed is inserted into a two-halves mold with a number of the specially formed recesses. The molten solder thereafter is introduced into the recesses. Upon cooling inside the recesses, molten solder solidifies and forms bumps on a substrate in the shape of the recesses of the mold. Only after solidification of the solder, the substrate is removed from the mold. Another invention that requires the molten solder to solidify before the device is removed from the mold is disclosed in the U.S. Pat. No. 5,244,143 to Ference at al. Both of the above-mentioned inventions still require strict quality and process control and inherent maintenance of the mold, including the verification of the precise formation of each recess in the mold to assure the identical shape and size of the resulting solder bumps. Any imperfections in the shape or dimensions of the recesses of the mold result in the non-uniform balls, and thus, potentially defective contacts. Moreover, some damage to the bumps may occur while opening the mold and removing the device from the mold.

Therefore, with the requirements of the increased complexity and density of the BGAs, there is an increased need for a method for forming solder bumps that is simple, cost-effective and time-effective. There is also a need for method that allows for batch processing of the highly uniform solder balls that requires relatively low investment in manpower and complicated equipment. It would be also advantageous to create a method of forming solder bumps that lends itself to high-volume production, and that has a low defects rate and a higher yield.

In light of the foregoing, it would be an advantage in the art to devise a time- and cost-effective solder ball formation process that forms solder balls having substantially uniform dimension, preferably in batch quantities, on a substrate.

SUMMARY OF THE INVENTION

The present invention is drawn to a method of making solder bump interconnections ranging from chip-level connections to either single chip or multichip modules, flip-chip packages and printed circuit board connections. The method of the present invention is especially useful for batch processing.

In the microelectronics industry, a "substrate" refers to one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated. In the context of this document the term a "die wafer" is intended to encompass "a substrate," "a semiconductor substrate," "a semiconductor device," a printed circuit board, and various packages for various levels of interconnection.

In accordance with the invention as embodied and broadly described herein, there is provided a die wafer or a substrate having a conductive contact location on its surface. This die wafer or substrate is placed in close proximity and aligned with a mold wafer having a pocket corresponding to the conductive contact location of the die wafer. A source of a molten solder is also provided to the mold wafer. The molten solder from the source is introduced into the pocket of the mold wafer such that the molten solder wets the conductive contact location aligned with the pocket. The molten solder that wets the conductive contact location is attracted and adheres to the conductive contact location. Before the molten solder inside the pocket is allowed to solidify, the die wafer and the mold wafer are separated from each other. The molten solder that adheres to the conductive contact location of the die wafer separates from the remaining molten solder in the pocket of the mold wafer. Upon separation from the remaining molten solder in the pocket of the mold wafer, natural forces act upon the molten solder that adheres to the conductive contact location so that it assumes a partially spherical shape. The molten solder in the partially spherical shape then solidifies to form the solder bump at the conductive contact location on the die wafer.

According to one aspect of the present invention, a large number of the uniform solder bumps can be simultaneously created on respective conductive contact locations on a substrate or die wafer. The present invention achieves the goal of simplicity. It is cost and time effective, and does not require a complex manufacturing process. Moreover, the present inventive method furthers uniformity of the resulting ball grid array due to the uniformity of natural forces acting upon the molten solder at each conductive contact location so as to form substantially uniform partially spherical solder balls thereat.

Other features and advantages of the invention will become apparent in light of the following description thereof.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Advantages of the present invention will become readily apparent to those skilled in the art to which the invention pertains from the following detailed description, wherein preferred embodiments of the invention are shown and described in the disclosure by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
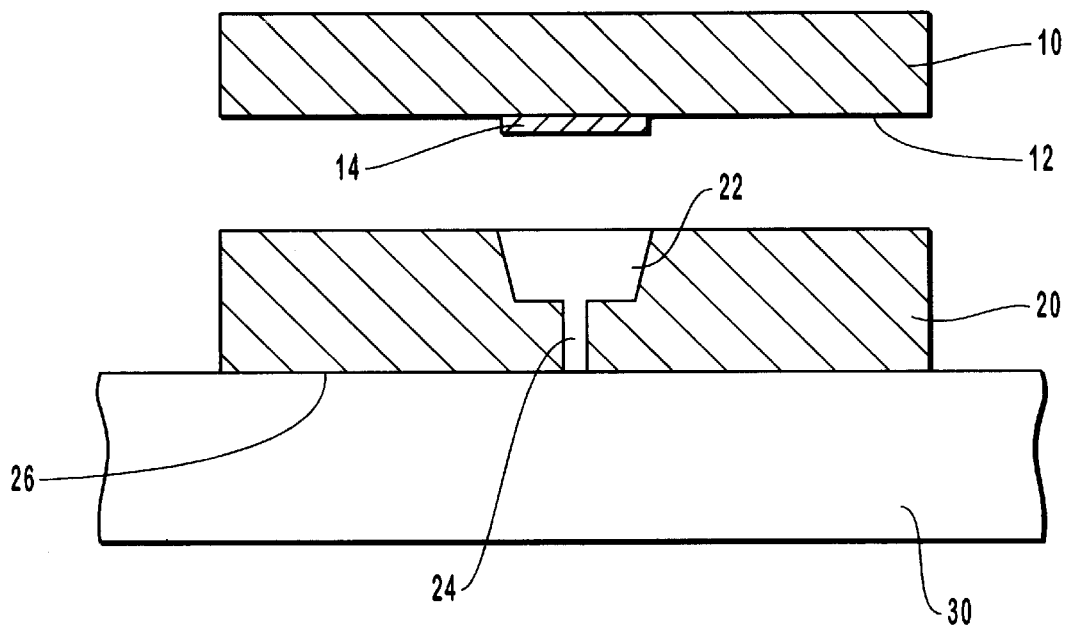
FIG. 1 is a cross sectional schematic representation of the apparatus for forming solder bumps according to the present invention, the apparatus including a die wafer having a conductive contact location upon a surface thereof, and a mold wafer having a pocket corresponding to the conductive contact location of the die wafer.

With reference to FIG. 1, an exemplary system for implementing the method of the present invention includes a die wafer 10 having a surface 12 and a mold wafer 20 having a backside 26. If die wafer 10 and mold wafer 20 are positioned one above another, backside 26 of mold wafer 20 is the side of mold wafer 20 that is opposite to the side which is adjacent die wafer 10. As was previously explained, the term "die wafer," as used herein, broadly refers to a number of devices, such as a single-chip wafer, multiple-chip wafer, a substrate, a printed circuit board, packages for various levels, or other assemblies requiring solder connections.

Surface 12 of die wafer 10 has a conductive contact location 14, which can be, for example, a BGA pad or a bond pad for a flip chip device. Conductive contact location 14 is preferably metallic and has the ability to be wetted by molten solder 30 and to form a strong bond with the portion of molten solder 30 that will wet conductive contact location 14. One example of the conventionally used material is copper, or copper having a layer of gold thereon. Surface 12 of die wafer 10 adjacent to conductive contact location 14, on the other hand, is preferably made of a solder non-wettable material, so that molten solder 30 does not adhere to it. Surface 12 may have just one contact location 14 or as many conductive contact locations 14 as desired. Conductive contact locations 14 may be arranged in any desired pattern. Conductive contact locations 14 are formed on die wafer 10 prior to the process of the present invention by any suitable conventional method and may have to be activated with flux so as to allow molten solder 30 to bond to the metal thereof.

As seen in FIG. 1, mold wafer 20 has a pocket 22. It is preferred to have at least as many pockets 22 on mold wafer 20 as there are conductive contact locations 14 on die wafer 10 and arranged in the same pattern, such that each contact location 14 has at least one corresponding pocket 22. These pockets 22 may be formed in mold wafer 20 by any of the existing methods, for example, by etching. Any other suitable method is also appropriate. Many different shapes and sizes of pockets 22 may be chosen. In a preferred embodiment of the present invention shown in FIG. 1, conductive contact location 14, when aligned with pocket 22, is completely surrounded by pocket 22 so that a perimeter of pocket 22 is at least as large as the perimeter of the corresponding contact location 14.

Mold wafer 20 communicates with a source of molten solder 30. In the context of the present invention, the term "solder" refers to an alloy that is used to join or seal metals by wetting the surfaces thereof and forming a joint by causing molecular attraction between the solder and the metal. It is preferred to use soft solders that have melting points up to approximately 600° F. Preferably, soft solders suitable for use with the present invention are those substantially composed of tin-lead alloys. The use of any other suitable solder is also contemplated within the scope of the present invention.

The source of molten solder 30 may be positioned adjacent mold wafer 20 or can be positioned in a distant location (not shown) that communicates with mold wafer 20 by any available means. By way of example and not limitation, such communication may be through a conduit. In one preferred embodiment shown in FIG. 1, the source of molten solder 30 is positioned adjacent mold wafer 20. In that embodiment, communication between the source of molten solder 30 and mold wafer 20 is accomplished through a passage 24 extending from a center of pocket 22 in mold wafer 20.

Passage 24 in communication with pocket 22 extends through backside 26 of mold wafer 20. There may be as many passages 24 as there are pockets 22 in mold wafer 20, so that each pocket is connected to the source of molten solder 30. The passage or passages 24 may be formed, for example, by laser drilling. However, any other conventional method for formation of passages 24 can be used with the present invention. Passage 24 in FIG. 1 is shown only for illustrative purposes and any other shape and form of passage 24 may be utilized. In addition, any suitable form of connection between the source of molten solder 30 and pocket 22 of mold wafer 20, is contemplated within the scope of the term "passage," as used in the present invention.

Figure 2:
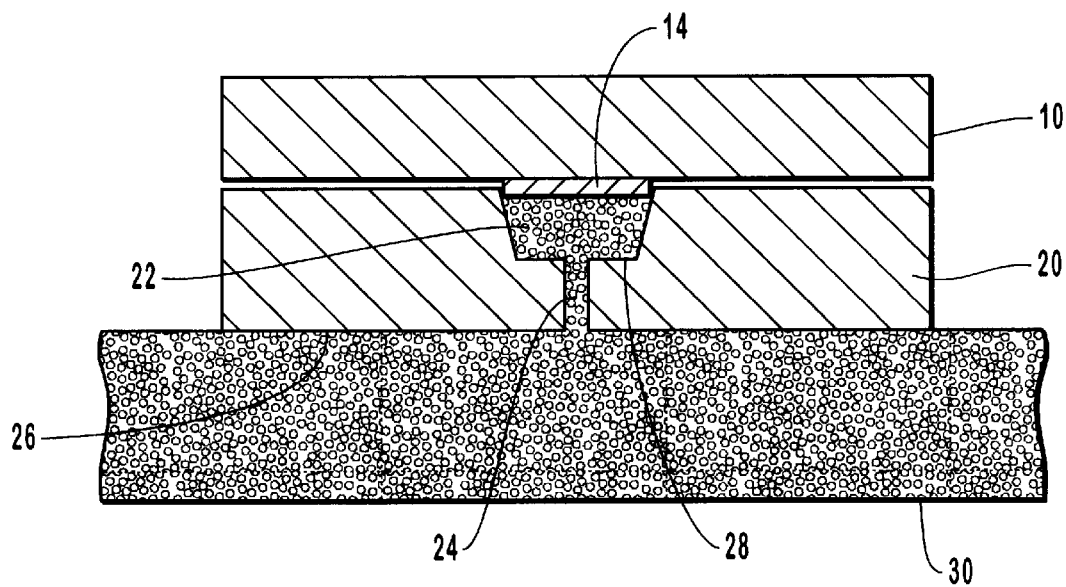
FIG. 2 is a cross sectional schematic representation of the apparatus seen in FIG. 1, wherein the pocket of the mold wafer corresponding in alignment to the conductive contact location of the die wafer are brought in close proximity, and molten solder is introduced into the pocket of the mold wafer so as to wet to the conductive contact location.

As shown by way of example in FIG. 2, the method of the present invention contemplates positioning of die wafer 10 and mold wafer 20 in close proximity with each other and in alignment of conductive contact location 14 of die wafer 10 and pocket 22 of mold wafer 20. The term "close proximity" includes within its scope the touching of the adjacent surfaces of die wafer 10 and mold wafer 20, as shown in the preferred embodiment of FIG. 2, where die wafer 10 and mold wafer 20 are positioned so that there is substantially no space between their adjacent surfaces. The movement and positioning of the die and mold wafers 10, 20 against each other may be accomplished by many different ways. For example, in one preferred embodiment, mold wafer 20 may be stationary at a predetermined location and die wafer 10 is moved relative to mold wafer 20. For or purposes of separating the wafers 10, 20, die wafer 10 may be moved in a vertical direction up and down relative to mold wafer 20. In another preferred embodiment, die wafer 10 may be stationary and it is mold wafer 20 that is moved. Yet in another preferred embodiment, both die wafer 10 and mold wafer 20 may be moved relative to each other.

After die wafer 10 and mold wafer 20 are positioned and aligned against each other as previously discussed, a molten solder 30 from a source is caused to flow into and fill pocket 22 of mold wafer 20 by any suitable method of introduction, for example by heating and/or under pressure. Some examples of the suitable methods of introduction of the molten solder are listed in the U.S. Pat. No. 5,381,848 to Trabucco, which is incorporated herein by reference. Molten solder 30 wets conductive contact location 14 and adheres to it. As can be appreciated by one skilled in the art, the amount of molten solder 30 within pocket 22 can be controlled employing any suitable means such as by controlling the volume of molten solder 30 forced into passage 24 by an overfeeding of the source of molten solder 30.

In another preferred embodiment of the present invention shown in FIG. 2, conductive contact location 14 is recessed within die wafer 10 such that it lies flush with surface 12 of die wafer 10. As in the previously preferred embodiment, conductive contact location 14, when aligned with pocket 22, is substantially completely surrounded thereby such that a perimeter of pocket 22 is at least as large as the perimeter of the corresponding contact location 14. Die wafer 10 and mold wafer 20 are articulated together such that surface 12 of die wafer 10 makes contact with mold wafer 20. Solder within pocket 22 fills pocket 22 so as to be substantially flush with mold wafer 20. After die wafer 10 is articulated against mold wafer 20, a pressure "spike" is sent into molten solder 30, thereby causing molten solder 30 to force more solder through channel 24 and to make contact with conductive contact location 14. Surface tension between conductive contact location 14 and molten solder 30 within pocket 22, and the size of pocket 22 forming a perimeter around conductive contact location 14 causes a measured amount of solder to adhere to conductive contact location 14. The pressure spike is of a measured duration and severity so as to cause a preferred amount of solder to adhere to conductive contact location 14.

In an embodiment of the inventive method, it is desirable to heat die wafer 10 to a temperature in a range from about 175° C. to about 350° C. prior to wetting conductive contact location 14 with molten solder 30. The heating of die wafer 10 enables a controlled rate at which molten solder 30 solidifies at conductive contact location 14.

Figure 3:
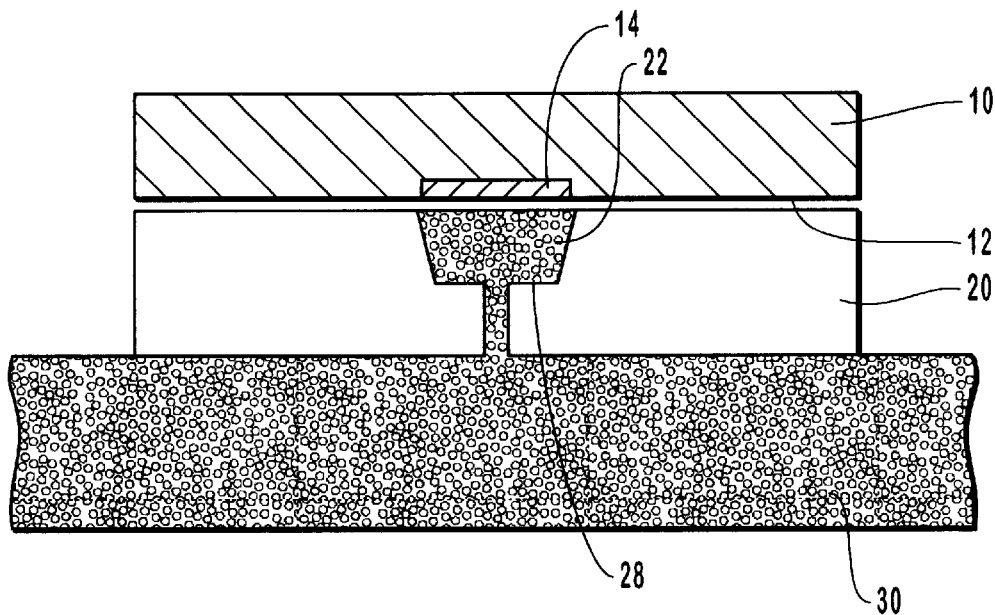
FIG. 3 is a cross sectional schematic view of an alternative embodiment of the inventive method wherein the die wafer has a conductive contact location that is recessed such that its lowermost surface and the lowermost surface of the die wafer are substantially flush.
Figure 4:
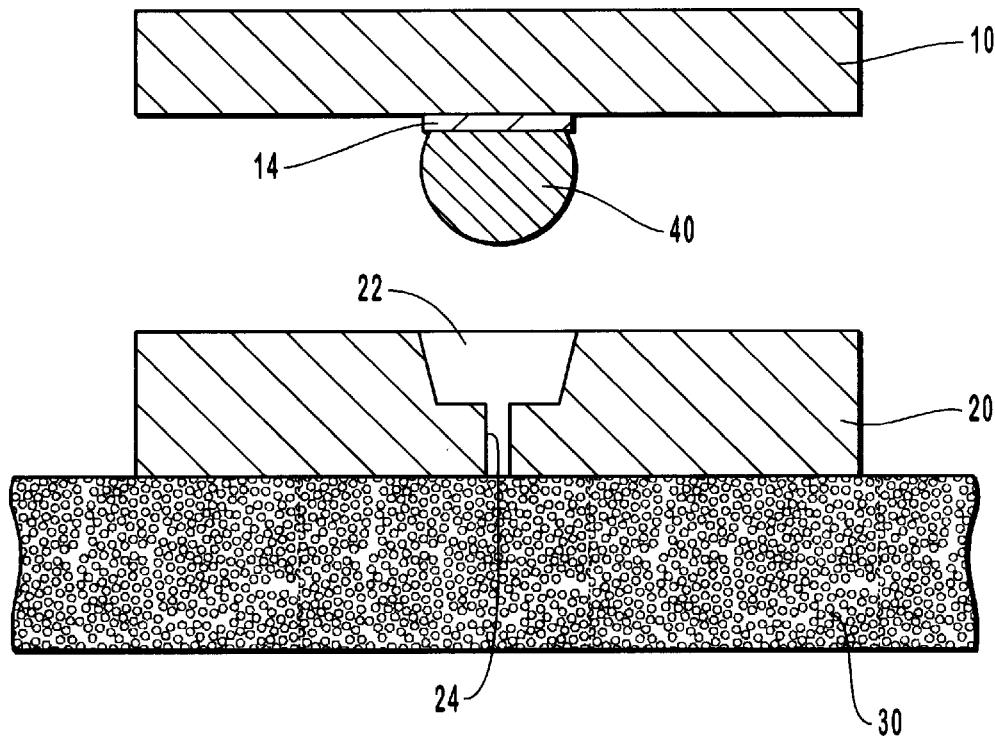
FIG. 4a is cross sectional schematic view of the apparatus of FIG. 2, further showing separation of the mold wafer and die wafer, where a portion of the molten solder in the pocket adheres to the conductive contact location and takes on a partially spherical shape.

As seen in FIGS. 3 and 4, after molten solder 30 wets conductive contact location 14 on die wafer 10, but before molten solder 30 in pocket 22 solidifies, introduction of molten solder 30 into pocket 22 of mold wafer 20 stops and separation of mold wafer 20 and die wafer 10 begins. For example, as was previously explained, mold wafer 20 preferably is stationary and the separation is achieved by moving die wafer 10 away from mold wafer 20. As an alternative, only mold wafer 20 may be movable or both wafers may be moved away from each other. While the distance between the respective wafers is increasing, surface tension causes molten solder 30 attracted to conductive contact location 14 to form a solder ball 40 in a partially or generally spherical shape at such conductive contact location 14, as seen in FIG. 3. Solder ball 40 is formed at conductive contact location 14 of die wafer 10 and thereafter quickly begins to air cool and solidify. Both complete formation and solidification of solder ball 40 happens outside pocket 22 of mold wafer 20. Therefore, the shape of solder ball 40 does not necessarily conform to the shape of pocket 22 and is therefore not dependent on precise measurements of all dimensions of pocket 22.

In one preferred embodiment of the present invention, die wafer 10 is positioned vertically above mold wafer 20 so that, in addition to the surface tension, the natural force of gravity allows the suspended molten solder 30 at conductive contact location 14 to assume a partially spherical shape.

Of course, any desired number of solder balls 40 may be formed simultaneously by providing a number of pockets 22 corresponding to conductive contact locations 14. All of conductive contact locations 14 have the identical shape and size, the whole surface of each contact location is wetted by the equal amount of molten solder 30, and all other physical conditions are identical. As a result, the identical forces act at each contact location which leads to the formation of the substantially uniform array of solder balls.

Figure 5:
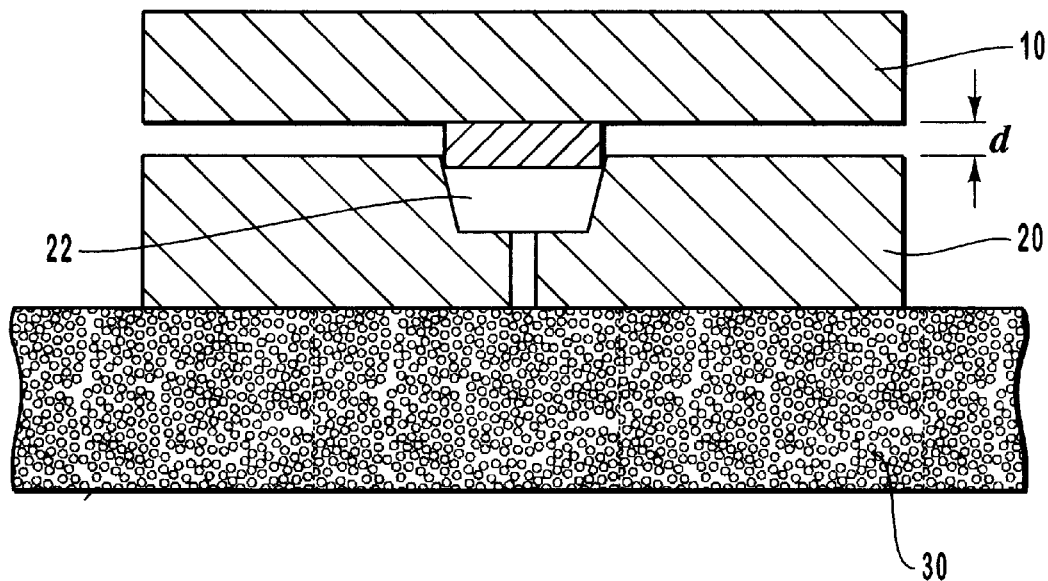
FIG. 5 is a cross sectional schematic view of an alternative embodiment of the apparatus seen in FIG. 1, wherein a distance or space is left between the die wafer and the mold wafer during solder ball formation.

FIG. 5 illustrates one variation of the embodiments of FIG. 2 and is illustrated in particularity for the embodiment of FIG. 2. Therein, it can be seen that a semiconductor substrate or die wafer 10 is positioned in close proximity with mold wafer 20 such that there is a clearance distance "d" between the adjacent surfaces of the die and the mold wafers 10, 20. This embodiment allows for a clearance distance "d" and is useful in the method of the present invention when die wafer 10 is located above mold wafer 20. The distance "d" between the adjacent surfaces of die wafer 10 and mold wafer 20 may be in the range of about 5 to about 100 microns, depending upon factors such as the ball size and pitch between the balls. It is also preferred to position die wafer 10 above mold wafer 20 such that conductive contact location 14 slightly projects into the corresponding pocket 22. The clearance distance "d" helps to assure that except for conductive contact location 14, there is no contact between molten solder 30 and surface 12 of die wafer 10.

Generally, the surface of die wafer 10 is made of any suitable non-conductive material that does not attract molten solder 30. As an alternative, surface 12 of die wafer 10 may be covered with a layer of solder non-wettable material. Mold wafer 20 is also made from a material that does not adhere to molten solder 30. For example, mold wafer 20 may be made of silicon. Therefore, only conductive contact locations 14 are conductive and attract molten solder 30. It is undesirable that surface 12 of die wafer 10 be contaminated by contact with spilled molten solder 30 that might wet some areas of surface 12 of die wafer 10 other than conductive contact locations 14. Therefore, maintaining of the distance "d" between die wafer 10 and mold wafer 20 assists in avoiding undesirable wetting of surface 12 of die wafer 10.

Figure 6:
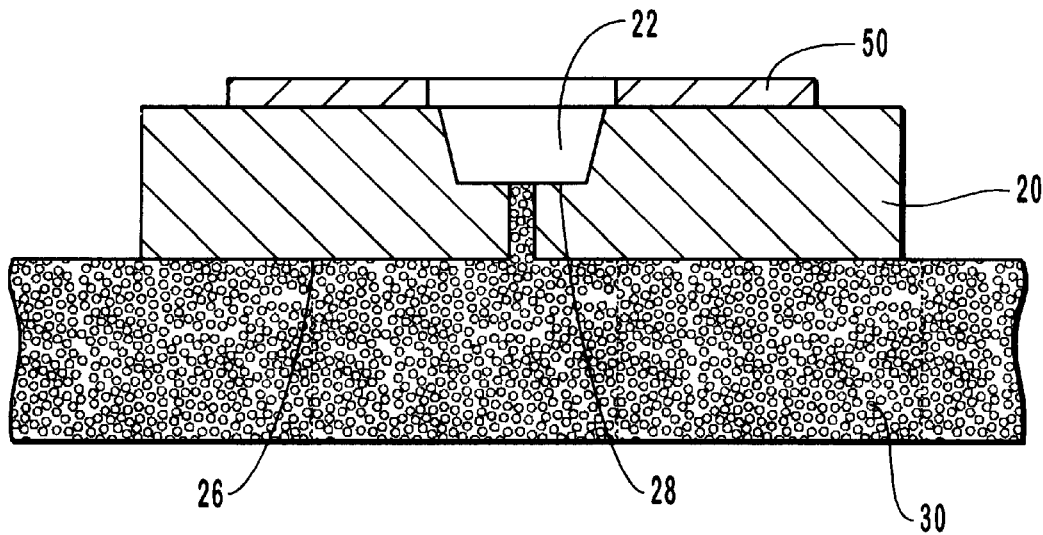
FIG. 6 is a cross sectional schematic view of another alternative embodiment of the present invention, and featuring a gasket between the mold wafer and the die wafer.

FIG. 6 depicts an alternative embodiment, which is especially useful for forming ball grid arrays of the present invention. If surface 12 of die wafer 10 and an adjacent surface of mold wafer 20 are not sealed against each other, molten solder 30 may spill on to portions thereof other that at conductive contact locations 14. To assure no such spillage, a sealing member 50 is placed between die wafer 10 and mold wafer 20 to surround each pocket. By way of example and not limitation, sealing member 50 may be in the form of a gasket. Die wafer 10 and mold wafer 20 are pressed against each other and sealing member 50 serves as a seal between the adjacent surfaces of die wafer 10 and mold wafer 20 in the area surrounding conductive contact locations 14 that are aligned with pockets 22. Only after the seal between the adjacent surfaces of die wafer 10 and mold wafer 20 is created, molten solder 30 is introduced into pockets 22. As a result, molten solder 30 in pocket 22, while allowed to wet conductive contact location 14, cannot spill over and wet the adjacent surface 12 of die wafer 10 surrounding conductive contact location 14. Therefore, sealing member 50 may be utilized to avoid the undesirable wetting of the surfaces surrounding conductive contact locations 14 by the spilled over molten solder 30.

The preferred alternative embodiment depicted in FIG. 3 may also be carried out using sealing member 50 as a gasket wherein a pressure spike is passed through molten solder 30 such that it bulges and makes contact with conductive contact location 14 but is contained by sealing member 50. Because sealing member 50 substantially resists flow of solder onto surface 12 of die wafer 10 except where conductive contact location 14 occurs, a measured amount of molten solder 30 is contacted with conductive contact location 14.

Sealing member 50 is preferably made of any suitable material that can form an effective seal with die wafer 10 and mold wafer 20 under pressure and that will not interact or damage die wafer 10. Examples of such material are silicone and elastomers. Any other suitable material, however, is contemplated within the scope of the present invention.

Figure 7:
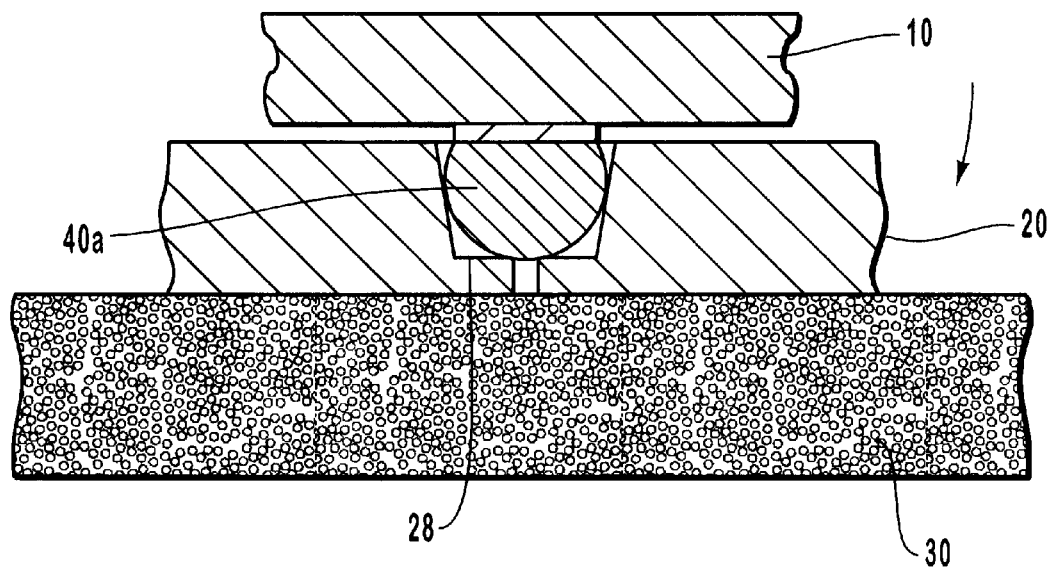
FIGS. 7 and 8 are cross sectional schematic views corresponding to an optional step that can be conducted in the inventive method, including deformation of a partially spherical solder ball.
Figure 8:
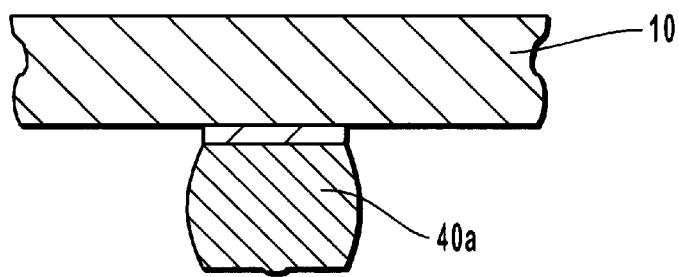

FIGS. 7 and 8 show the optional step of the present invention which allows, if desired, to modify the shape of solder balls 40 made by the above described method of the present invention by which a solder ball 40a with one flat side may be created. At the end of the process of formation of the solder ball 40 through the steps described in relation to FIGS. 1–4, die wafer 10 with the attached solder balls 40 is positioned away from mold wafer 20. Die wafer 10 and mold wafer 20 may be brought back towards each other so that each solder ball 40 is aligned with and inserted into the corresponding pocket 22 of mold wafer 20.

Prior to the insertion of solder ball 40 into pocket 22, pocket 22 preferably does not contain any solid or molten solder 30 therein, which is accomplished by any suitable conventional method. By way of example and not limitation, the remaining molten solder 30 may be forced back from pocket 22 through passage 24 into the source thereof by creating a negative pressure in passage 24. As long as no molten solder 30 is left in pocket 22 itself, the fact that some molten solder 30 can still be present in passage 24 is not critical. After molten solder 30 has partially solidified, molten solder 30 is pressed into mold wafer 20. Preferably, pocket 22 will be at a temperature above the reflow temperature. A portion of molten solder 30 that contacts pocket 22 should turn to a liquid state. All of the ball of molten solder 30, however, should not turn to a liquid state.

As seen in FIG. 7, after molten solder 30 is removed from pockets 22, die wafer 10 and mold wafer 20 are moved towards each other until solder ball 40 is pressed against a bottom 28 of pocket 22. The result is a flattened solder ball 40a as shown in FIG. 7. Since all of solder balls 40 are moved simultaneously an equal distance with equal forces into the similarly and corresponding shaped pockets 22, this optional step allows the creation of an array of the uniformly modified solder balls 40a. Care must be taken, however, not to leave solder ball 40a within pocket 22 for a period sufficient to cause solder ball 40a to entirely reliquify. An alternative method for reshaping solder ball 40a is to apply solder to die wafer 10 and to allow both surface 12 of die wafer 10 and mold wafer 20 to cool below the liquidus temperature of molten solder 30 where solder ball 40a makes contact with surfaces of pocket 22 and with conductive contact location 14. By this embodiment, solder ball 40a will take the shape of pocket 22. Molten solder 30 within passage 24, if present at all, will separate from solder ball 40 once die wafer 10 and mold wafer 20 are separated.

As can be appreciated by one skilled in the art, the shape of solder balls 40 may be that of any desirable shape by choosing the corresponding shape of pocket 22 of mold wafer 20. More than one side of solder ball 40 can also be reshaped. The above embodiments can also be used to substantially planarize a BGA. That is, the height of all of the solder balls can be made substantially uniform for a contact or seating plane where contact of solder ball 40*a* is assured to be made with bottom 28 of pocket 22.

It will be understood by one skilled led in the art that BGAs may be formed simultaneously on more than one die wafer 10 without departing from the spirit of the present invention.

The present invention may be embodied in other specific forms without departing from its spirit or essential characteristics. It will be understood by on of ordinary skill in the art that details which are not essential to the inventive features for simplicity have been omitted from the description and the drawings, and that such details may be readily incorporated without undue experimentation. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming solder balls on a die wafer comprising:
    providing a die wafer having an integrated circuit therein that is in electrical communication with a contact location on a surface of said die wafer;
    providing a mold wafer having a pocket corresponding to the contact location;
    positioning the die wafer and the mold wafer such that the contact location of the die wafer is aligned with the pocket of the mold wafer;
    introducing a molten solder into the pocket of the mold wafer such that the molten solder wets the contact location of the die wafer;
    separating the die wafer from the mold wafer before the molten solder in the pocket solidifies, wherein a portion of the molten solder adheres to the contact location and is separated from another portion of the molten solder that remains in the pocket.

2. The method of claim 1, further comprising providing a source of the molten solder adjacent the mold wafer before introducing the molten solder into the pocket.

3. The method of claim 1, wherein introducing the molten solder into the pocket of the mold wafer such that the molten solder wets the contact location of the die wafer comprises controlling the amount of the molten solder in the pocket.

4. The method of claim 1, further comprising forming the pocket in the mold wafer.

5. The method of claim 4, further providing a passage extending from the source of the molten solder through the mold wafer to the pocket, wherein the molten solder is introduced to the pocket through the passage.

6. The method of claim 5, wherein introducing the molten solder into the pocket of the mold wafer is accomplished by forcing the molten solder from the source of the molten solder through the passage into the pocket of the mold wafer.

7. The method of claim 1, wherein separating the die wafer from the mold wafer before the molten solder solidifies in the pocket further comprises:
    allowing the portion of the molten solder that adheres to the contact location to form a solder ball at the contact location after the die wafer and the mold wafer are separated from each other; and
    permitting the solder ball on the contact location of the die wafer to solidify after the die wafer and the mold wafer are separated from each other.

8. The method of claim 1, wherein the contact location extends into the pocket while the molten solder wets the contact location of the die wafer.

9. The method of claim 1, wherein:
    the contact location is surrounded by adjacent surfaces on the die wafer;
    the pocket is surrounded by adjacent surfaces on the mold wafer; and
    a sealing member is in contact with the adjacent surfaces on the die wafer and the adjacent surfaces on the mold wafer while the molten solder wets the contact location of the die wafer; and
    the sealing member prevents the molten solder from wetting the adjacent surfaces on the die wafer and the adjacent surfaces on the mold wafer.

10. The method of claim 1, further comprising heating the die wafer to a temperature in a range from about 150° C. to about 350° C. prior to wetting the contact location of the die wafer with the molten solder.

11. A method of forming solder balls on a die wafer comprising:
    providing a die wafer having a plurality of contact locations and a mold wafer having a plurality of pockets, wherein at least some of the pockets correspond to the contact locations;
    positioning the die wafer and the mold wafer such that the contact locations of the die wafer are aligned with the respective pockets of the mold wafer;
    introducing a molten solder into the pockets of the mold wafer such that the molten solder wets the respective contact locations of the die wafer;
    separating the die wafer from the mold wafer before the molten solder in the respective pockets and the molten solder on the respective contact locations solidifies.

12. The method of claim 11, wherein the contact locations of the die wafer are arranged in a pattern of rows and columns.

13. The method of claim 11, wherein the die wafer is positioned above the mold wafer such that gravity exerts a force on the molten solder on the respective contact locations away from the die wafer.

14. The method of claim 11, wherein:
    each said contact location is surrounded by adjacent surfaces on the die wafer;
    each said pocket is surrounded by adjacent surfaces on the mold wafer; and;
    a sealing member is in contact with and prevents the molten solder from wetting:
        the adjacent surfaces surrounding the contact locations on the die wafer; and
        the adjacent surfaces surrounding the pockets on the mold wafer.

15. The method of claim 14, wherein:
    the adjacent surfaces on the die wafer and the adjacent surfaces on the mold wafer are both planar; and
    while introducing the molten solder into the pockets of the mold wafer:
        the adjacent surfaces surrounding the contact locations on the die wafer; and
        the adjacent surfaces surrounding the pockets on the mold wafer are separated by a distance in the range of about 5 microns to about 125 microns.

16. A method of forming solder bumps on a die wafer comprising:
    providing a die wafer having a pattern of contact locations;
    providing a mold wafer having a pattern of pockets corresponding to the pattern of the contact locations;
    providing a source of molten solder in communication with the mold wafer;
    positioning the mold wafer between the die wafer and gravitational force;

aligning the pockets of the mold wafer with respective contact locations of the die wafer;

introducing a molten solder from a source thereof into the pockets such that the molten solder in each said pocket wets the respective contact location corresponding thereto;

separating the die wafer and the mold wafer from each other before the molten solder in the pockets and the molten solder on the contact locations solidifies.

17. The method of claim 16 further comprising, after separating the die wafer and the mold wafer:

emptying the molten solder from the pockets;

solidifying into respective solid solder balls the molten solder that wet each respective contact location;

placing each respective solid solder ball into the pocket corresponding thereto;

pressing the solid solder balls against the respective pockets to modify the shape of the solid solder balls.

18. The method of claim 16, wherein the mold wafer has a backside and the source of the molten solder communicates said molten solid with the mold wafer through said backside.

19. A method of forming a ball grid array comprising:

providing a die wafer having an integrated circuit therein and a pattern of conductive contact locations on a surface of the die wafer in electrical communication with the pattern of conductive contact locations;

providing a mold wafer having pockets arranged in a pattern corresponding to the pattern of the contact locations of the die wafer;

providing a source of a molten solder for communicating said molten solder with the pockets in the mold wafer;

aligning the contact locations on the surface of the die wafer with the corresponding pockets of the mold wafer;

introducing the molten solder from the source of the molten solder into the pockets of the mold wafer;

allowing the molten solder in the pockets to wet the contact locations aligned with each corresponding pocket;

moving the die wafer away from the mold wafer before allowing the molten solder in the pockets and on the wetted contact locations to solidify;

cooling the molten solder that wet the contact locations to form solid solder at the contact locations of the die wafer.

20. The method of claim 19, wherein:

the contact locations are surrounded by adjacent surfaces on the die wafer;

the pockets are surrounded by adjacent surfaces on the mold wafer; and while allowing the molten solder to wet the contact locations aligned with each corresponding pocket, a sealing member is in contact with and prevents the molten solder from wetting:

the adjacent surfaces surrounding each said conductive contact location on the die wafer; and the adjacent surfaces surrounding each said pocket on the mold wafer.

21. The method of claim 19, wherein while allowing the molten solder to wet the contact locations aligned with each corresponding pocket, each said conductive contact location projects into the pocket corresponding thereto.

22. The method of claim 19, wherein aligning the contact locations on the surface of the die wafer with the corresponding pockets of the mold wafer further comprises positioning the mold wafer between the die wafer and gravitational force.

23. A method of forming a solder ball on a die wafer comprising:

providing a die wafer having a contact location, wherein said die wafer has an integrated circuit therein in electrical communication with said contact location;

contacting the contact location with a molten solder from a source thereof;

separating a portion of said molten solder that adheres to the contact location from the molten solder of said source of said molten solder; wherein:

said portion of said molten solder is isolated from physical contact with the molten solder of said source of said molten solder; and said portion of the molten solder that adheres to the contact location of the die wafer is positioned in between said contact location and gravitational force acting upon said portion of the molten solder that adheres to the contact location of the die wafer;

forming a partially spherical solid solder ball from said portion of the molten solder while said solder ball is isolated from contact except at said contact location.

24. A method of forming solder balls on a die wafer comprising:

providing a die wafer having an integrated circuit therein that is in electrical communication with a contact location on a surface of said die wafer;

providing a mold wafer having a pocket corresponding to the contact location, the mold wafer having a passage extending therethrough and terminating at said pocket;

providing a source of a molten solder adjacent the mold wafer;

positioning the die wafer and the mold wafer such that the contact location of the die wafer is aligned with the pocket of the mold wafer;

introducing the molten solder from the source through the passage and into the pocket such that the molten solder wets the contact location of the die wafer;

separating the die wafer from the mold wafer before the molten solder in the pocket solidifies, wherein a portion of the molten solder adheres to the contact location and is separated from the molder solder in the pocket;

allowing the portion of the molten solder that adheres to the contact location to form a solder ball at the contact location after the die wafer and the mold wafer are separated from each other; and permitting the solder ball on the contact location of the die wafer to solidify after the die wafer and the mold wafer are separated from each other.

25. The method of claim 23, wherein:

the contact location is surrounded by adjacent surfaces on the die wafer;

the pocket is surrounded by adjacent surfaces on the mold wafer; and a sealing member is in contact with and prevents the molten solder from wetting:

the adjacent surfaces surrounding the contact location on the die wafer; and the adjacent surfaces surrounding the pocket on the mold wafer.

26. The method of claim 23, further comprising heating the die wafer to a temperature in a range from about 175° C. to about 350° C. prior to wetting the contact location of the die wafer with the molten solder.

* * * * *

UNITED STATES PATENT AND TRADEMARK OFFICE
CERTIFICATE OF CORRECTION

PATENT NO. : 6,189,772 B1 Page 1 of 1
DATED : February 20, 2001
INVENTOR(S) : David R. Hembree It is certified that error appears in the above-identified patent and that said Letters Patent is hereby corrected as shown below:

Column 2,
Line 25, after "Ference" change "at al." to -- et al. --
Line 40, before "method that allows" insert -- a --

Column 4,
Line 8, after "FIG. 4" change "a is" to -- is a --

Column 5,
Line 63, before "purposes of" delete "or"

Column 7,
Line 50, after "thereof other" change "that" to -- than --

Column 9,
Line 3, after "one skilled" delete "led"
Line 9, after "understood by" change "on" to -- one --

Column 12,
Lines 3-23, delete claim 23
Line 50, after "The method of" change "claim 23," to -- claim 24, --
Line 61, after "The method of" change "claim 23," to -- claim 24, --
Line 65, add Claim 27 -- The method of claim 24, wherein the contact location extends into the pocket while the molten solder wets the contact location of the die wafer. --

Signed and Sealed this

Twenty-first Day of October, 2003

JAMES E. ROGAN
*Director of the United States Patent and Trademark Office*